United States Patent
Smith

(10) Patent No.: US 8,630,072 B2
(45) Date of Patent: *Jan. 14, 2014

(54) CIRCUITS INCLUDING A DIODE STRING COMPRISED OF BIPOLAR STAGES HAVING AN ADJUSTABLE PSEUDO BETA FOR ESD PROTECTION

(75) Inventor: Jeremy Charles Smith, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 1 day.

This patent is subject to a terminal disclaimer.

(21) Appl. No.: 13/194,748

(22) Filed: Jul. 29, 2011

(65) Prior Publication Data

US 2013/0027822 A1     Jan. 31, 2013

(51) Int. Cl.
*H02H 9/04* (2006.01)

(52) U.S. Cl.
USPC .......................................................... 361/56

(58) Field of Classification Search
USPC ............................................................ 361/56
See application file for complete search history.

(56) References Cited

U.S. PATENT DOCUMENTS

| | | | |
|---|---|---|---|
| 5,530,612 A | 6/1996 | Maloney | |
| 5,534,792 A * | 7/1996 | Lillis et al. | 326/30 |
| 5,719,737 A | 2/1998 | Maloney | |
| 5,808,342 A | 9/1998 | Chen et al. | |
| 5,811,857 A | 9/1998 | Assaderaghi et al. | |
| 5,917,336 A | 6/1999 | Smith et al. | |
| 5,959,820 A | 9/1999 | Ker et al. | |
| 6,002,568 A | 12/1999 | Ker et al. | |
| 6,034,397 A | 3/2000 | Voldman | |
| 6,157,530 A | 12/2000 | Pequignot et al. | |
| 6,215,637 B1 | 4/2001 | Teggatz et al. | |
| 6,275,089 B1 | 8/2001 | Song et al. | |
| 6,292,343 B1 | 9/2001 | Pequignot et al. | |
| 6,396,107 B1 * | 5/2002 | Brennan et al. | 257/362 |
| 6,645,820 B1 | 11/2003 | Peng et al. | |
| 6,671,153 B1 | 12/2003 | Ker et al. | |
| 7,027,276 B2 | 4/2006 | Chen | |
| 7,154,724 B2 | 12/2006 | Wu et al. | |

(Continued)

OTHER PUBLICATIONS

Ming-Dou Ker, Tung-Yang Chen, and Chyh-Yih Chang; "ESD Protection Design for CMOS RF Integrated Circuits"; ESD Association, 2001, pp. 1-9; ESD Association, 7900 Turin Rd, Bldg 3, Rome, New York 13440-2069.

(Continued)

*Primary Examiner* — Jared Fureman
*Assistant Examiner* — Kevin J Comber
(74) *Attorney, Agent, or Firm* — Cesari & Reed, LLP; R. Michael Reed

(57) ABSTRACT

A circuit includes an input terminal and an electrostatic discharge (ESD) protection circuit. The ESD protection circuit includes a diode string formed from a plurality of P-N junction devices arranged in series. The diode string includes an input coupled to the input terminal and includes at least one output coupled to a power supply terminal. The circuit further includes a plurality of shunt elements. Each of the plurality of shunt elements includes a first terminal coupled to one of the plurality of P-N junction devices and a second terminal coupled to the power supply terminal. Each of the plurality of shunt elements is controllable to selectively couple the one of the plurality of P-N junction devices to the power supply terminal to distribute current flow across the diode string in response to an ESD event.

20 Claims, 5 Drawing Sheets

(56) References Cited

U.S. PATENT DOCUMENTS

| | | | |
|---|---|---|---|
| 7,196,890 | B2 | 3/2007 | Smith |
| 7,291,888 | B2 | 11/2007 | Huang |
| 7,292,421 | B2 | 11/2007 | Smith |
| 7,385,383 | B2 | 6/2008 | Reddy et al. |
| 7,408,752 | B2 | 8/2008 | Ma et al. |
| 7,622,775 | B2 | 11/2009 | Li et al. |
| 7,649,229 | B2 | 1/2010 | Kato |
| 7,773,355 | B2 | 8/2010 | Ma et al. |
| 7,813,092 | B2 | 10/2010 | Ma et al. |
| 7,859,803 | B2 | 12/2010 | Ma et al. |
| 7,859,807 | B2 | 12/2010 | Wang et al. |
| 2006/0050451 | A1 | 3/2006 | Jen-Chou |
| 2007/0236847 | A1 | 10/2007 | Jiang et al. |
| 2009/0268357 | A1 | 10/2009 | Reynders et al. |
| 2010/0103570 | A1 | 4/2010 | Song et al. |

OTHER PUBLICATIONS

Ming-Dou Ker, Tung-Yang Chen, Tai-Ho Wang, and Chung-Yu Wu; "On-Chip ESD Protection Design by Using Polysilicon Diodes in CMOS Process"; IEEE Journal of Solid-State Circuits, vol. 36, No. 4, pp. 676-686, Apr. 2001.

Steven H. Voldman; "The State of the Art of Electrostatic Discharge Protection; Physics, Technology, Circuits, Design, Simulation, and Scaling"; IEEE Journal of Solid-State Circuits, vol. 34, No. 9, pp. 1272-1282, Sep. 1999.

Ming-Dou Ker, Hun-Hsien Chang, and Chung-Yu Wu; "A Gate-Coupled PTLSCR/NTLSCR ESD Protection Circuit for Deep-Submicron Low-Voltage CMOS IC's"; IEEE Journal of Solid-State Circuits, vol. 32, No. 1, pp. 38-51, Jan. 1997.

Ming-Dou Ker, Chyh-Yih Chang, and Yi-Shu Chang; "ESD Protection Design to Overcome Internal Damage on Interface Circuits of a CMOS IC With Multiple Separated Power Pins"; IEEE Transactions on Components and Packaging Technologies, vol. 27, No. 3, pp. 445-451, Sep. 2004.

Julian Zhiliang Chen, Ajith Amerasekera, and Charvaka Duvvery, "Design Methodology for Optimizing Gate Driven ESD Circuits in Submicron CMOS Processes," Proceedings of the Electrical Overstress/Electrostatic Discharge Symposium, Sep. 25, 1997, pp. 230-239.

* cited by examiner

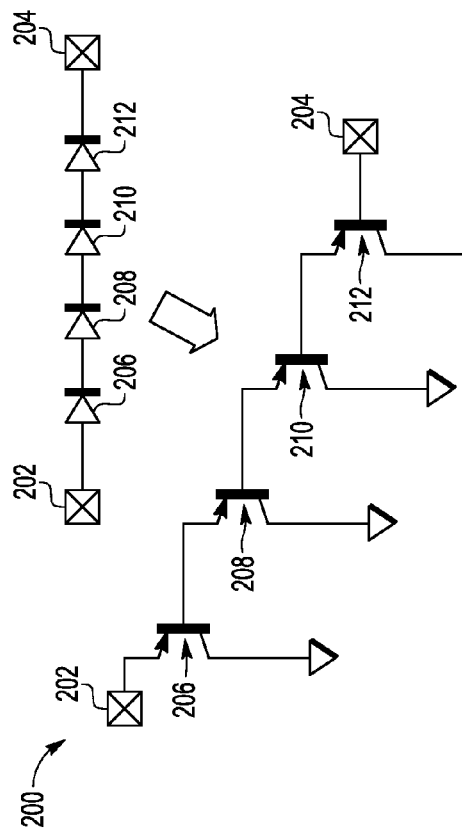
FIG. 2
(RELATED ART)
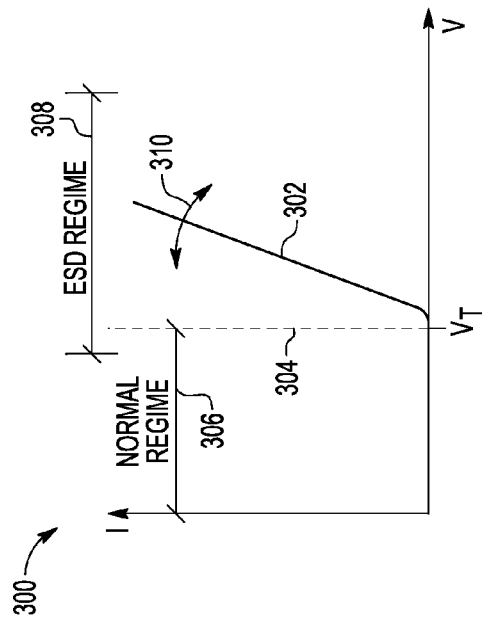
FIG. 1
(RELATED ART)
FIG. 3
(RELATED ART)

CIRCUITS INCLUDING A DIODE STRING COMPRISED OF BIPOLAR STAGES HAVING AN ADJUSTABLE PSEUDO BETA FOR ESD PROTECTION

FIELD

The present disclosure is generally related to electrostatic discharge protection circuits, and more particularly to diode strings for electrostatic discharge protection.

BACKGROUND

Electrostatic discharge (ESD) refers to the phenomenon whereby an electrical current of high amplitude and short duration is discharged at the package nodes of an integrated circuit due to static charge build-up on the integrated circuit (IC) package or on a nearby object, such as a human being or an IC handling machine. Without ESD protection circuitry, an ESD event can damage the IC. Accordingly, circuit designers have developed ESD protection circuitry to discharge ESD currents in a short time in a nondestructive manner.

A diode string represents one type of ESD circuit that can be used to discharge ESD currents. The diode string is formed in bulk material of a semiconductor substrate by series-connecting P-N junctions typically formed in nwell regions. In particular, each n-well formed in the P-type bulk material is tapped via an n+ diffusion and is connected to the p+ junction of the next diode. The combination of a P+ diffusion contained in an nwell over a P-type substrate forms a parasitic PNP transistor by default, such that the "diode string" is really a chain of PNP transistors. Within the diode string, each PNP transistor has a vertical current gain ($\beta$), which effects the diode string operation, including the total substrate current, the effective on resistance ($R_{on}$), and so on.

As the process technologies advance and the semiconductor technology scales, the vertical current gain ($\beta$) also tends to get smaller due to the n-well retrograde doping profile, in order to fight latch-up. Unfortunately, as the vertical current gain ($\beta$) decreases, the on-resistance ($R_{on}$) of the diode string increases, which can adversely impact the performance of the diode string in response to an ESD event by reducing the amount of current shunted to the substrate. In general, shunting current to the substrate provides an extra current path which contributes to lowering the effective resistance otherwise exhibited by the series connection of diodes.

SUMMARY

In an embodiment, a circuit includes an input terminal and an electrostatic discharge (ESD) protection circuit. The ESD protection circuit includes a diode string formed from a plurality of P-N junction devices arranged in series. The diode string includes an input coupled to the input terminal and includes at least one output coupled to a first power supply terminal. The circuit further includes a plurality of shunt elements. Each of the plurality of shunt elements includes a first terminal coupled to one of the plurality of P-N junction devices and a second terminal coupled to the first power supply terminal. Each of the plurality of shunt elements is controllable to selectively couple the one of the plurality of P-N junction devices to the power supply terminal to distribute current flow to the first power supply terminal in response to an ESD event.

In another embodiment, a circuit includes an input terminal and an ESD circuit. The ESD protection circuit includes a diode string formed from P-N junctions of a plurality of bipolar junction transistors. The diode string includes a first terminal coupled to the input terminal and a second terminal coupled to a power supply terminal. The ESD protection circuit further includes a plurality of shunt elements, each of which includes a first terminal coupled to an anode terminal of a diode of the diode string and a second terminal to the power supply terminal. Each of the plurality of shunt elements is controllable to selectively provide a current flow path from the anode terminal to the power supply terminal in response to an ESD event.

In still another embodiment, a circuit for ESD protection includes a first conductive terminal, a second conductive terminal, and a diode string formed from P-N junctions of a plurality of bipolar junction transistors. The diode string includes an input coupled to the first conductive terminal and includes an output coupled to the second conductive terminal. The circuit further includes a plurality of controllable shunt elements, each of which has a first terminal coupled to an anode of a diode from the diode string, a second terminal coupled to a power supply terminal, and a control terminal. The circuit also includes a controller coupled to the control terminal of each of the plurality of controllable shunt elements to controllably alter the effective-beta or "pseudo-beta" of each diode of the diode string in response to an ESD event.

BRIEF DESCRIPTION OF THE DRAWINGS

FIG. 1 is a cross-sectional block diagram of a portion of a circuit including semiconductor substrate having p+ and n+ diffused areas and corresponding electrical connections for forming a PNP bipolar junction transistor.

FIG. 2 is a circuit diagram of a multi-stage n-well diode string for providing ESD protection.

FIG. 3 is a graph of voltage versus current for conventional diode string.

In the following discussion, the use of the same reference numerals in different drawings indicates similar or identical items.

DETAILED DESCRIPTION OF ILLUSTRATIVE EMBODIMENTS

Figure 4:
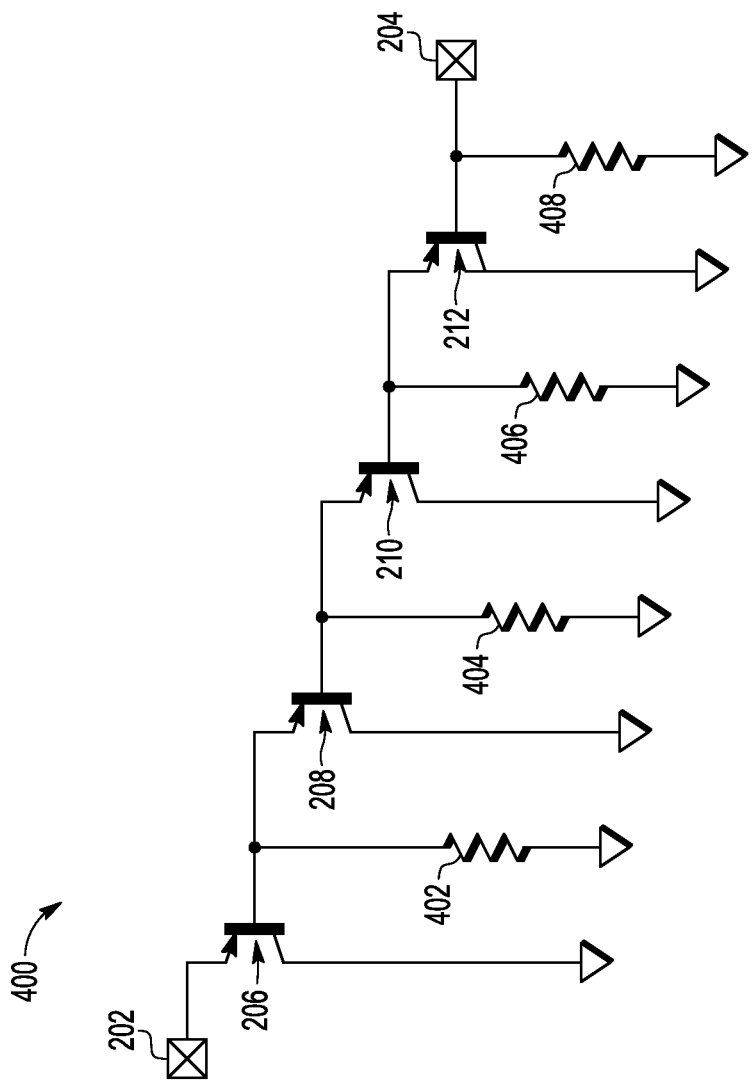
FIG. 4 is a circuit diagram of an ESD protection circuit including a multi-stage diode string with a controlled shunt element added to each stage of the diode string.

In general, the vertical current gain ($\beta$) of the transistors of a diode string strongly determines string characteristics, such as total substrate current, on-resistance, and the like. Additionally, the vertical current gain ($\beta$) also varies with both temperature and transistor collector current density.

The collector current ($I_C$) of the transistor is proportional to the emitter current ($I_E$) times the vertical current gain ($\beta$) over the vertical current gain plus one ($\beta$+1) as showing the following equation:

$$I_C = \frac{\beta}{\beta+1} I_E \quad (1)$$

If we consider a 4-stage diode string as shown in FIG. 2, and assume a constant vertical current gain (β), the total substrate current (also total collector current) can be derived through analysis (as shown elsewhere) to be given by the following equation:

$$I_{SUB} = I_E \left[ \frac{\beta}{\beta+1} + \frac{\beta}{(\beta+1)^2} + \frac{\beta}{(\beta+1)^3} + \frac{\beta}{(\beta+1)^4} \right] \quad (2)$$

As technology scales, (β) tends to reduce in magnitude due to retrograde nwell doping profiles. However, even if the vertical current gain (β) were equal to one for this 4-stage diode string, up to ninety-four percent (½+¼+⅛+1/16) of the injected emitter current flows to the substrate instead of through the diode string.

Similarly, by a related analysis the on-resistance $R_{ON}$ exhibited by a 4-high diode string is given by the following equation:

$$R_{ON} = R_D \left[ 1 + \frac{1}{\beta+1} + \frac{1}{(B+1)^2} + \frac{1}{(\beta+1)^3} \right] \quad (3)$$

where $R_D$ is the on-resistance of one diode in the string. As the technology scales and the vertical current gain (β) approaches zero, the on-resistance ($R_{ON}$) of the diode string approaches number of stages times the resistance of each diode (i.e., $4R_D$) as compared to a lower value produced by non-zero (β), such as two or two and a half times the diode resistance, which would be better in terms of the on resistance.

Embodiments of a circuit and associated methods are described below with respect to FIGS. 4-9 that include a controlled or controllable shunt element coupled to each stage of the diode stack. The controllable shunt elements are selectable to alter a resistance at the emitter of each transistor, providing extra shunting to ground for each stage and providing a higher effective current gain (β) or pseudo beta. The controllable shunt elements operate to lower the overall resistance exhibited by the diode string more independently of the default current gain (β) of the fabrication process. Further, the controllable shunt elements make it possible to modulate the effective electrical height of the diode stack or string by modulating the resistance values of the controllable shunt elements and by adjusting device sizes. Further, the controllable shunt elements make it possible to provide a lower "holding voltage" during an ESD event, for example, triggering at a threshold corresponding to four diodes and holding at threshold levels corresponding to two or three diodes. In this instance, the diode stack can be provided that implements current-voltage curves having a shape that looks like a snapback by just using the diodes (i.e., a negative differential resistance regime).

Before addressing the circuits for providing ESD protection using a pseudo beta (β), it is useful to understand the basic operation of a PNP bipolar junction transistor (BJT) and the corresponding performance provided by a diode string comprised of PNP BJT devices. An example of a PNP BJT device is described below with respect to FIG. 1.

FIG. 1 is a cross-sectional block diagram of a portion of a circuit 100 including a semiconductor substrate 102 having p+ and n+ diffused areas and corresponding electrical connections for forming a PNP BJT. Semiconductor substrate 102 is comprised of P-type bulk material including an n-well 104 diffused into the bulk material. Further, a p+ diffusion area 106 is formed in the n-well as is an n+ diffusion area 108. The semiconductor substrate 102 further includes a second p+ diffusion area 110.

A highly conductive region (salicide) 107 is formed on p+ diffusion area 106 for electrically connecting to an emitter terminal 116. Similarly, conductive regions 109 and 111 connect n+ diffusion area 108 and p+ diffusion area 110 to base terminal 118 and collector terminal 120, respectively. A P-N junction connection forms between p+ diffusion area 106 and the n-well 104. The n+ diffusion area 108 forms an ohmic contact to the cathode of the PN junction, including a parasitic resistance 114. Further a parasitic resistance 122 couples the interior collector region 124 to the collector terminal 120 through the p-type bulk material of the semiconductor substrate 102.

In active mode, the emitter-base voltage ($V_{EB}$) between the emitter terminal 116 and the base terminal 118 causes the p+ type emitter to be higher in electrical potential than the n+ type base, forward biasing the base-emitter junction. The base current ($I_B$) flowing out from the n+ diffused area 108 to the base terminal 118 is proportional to the emitter current ($I_E$) flowing from the emitter terminal 116 into p+ diffused area 106 as a function of one over the vertical current gain (β) plus 1 as shown in Equation 4 below.

$$I_B = \frac{1}{\beta+1} I_E \quad (4)$$

Further, the collector current ($I_C$) is proportional to the emitter current ($I_E$) as a function of the vertical current gain divided by the vertical current gain (β) plus one according to Equation 5 below:

$$I_C = \frac{\beta}{\beta+1} I_E \quad (5)$$

In a diode stack or diode string, several BJT devices, such as the PNP BJT 112, are connected such that the n+ diffusion area 108 and associated conductor 109 is connected to the p+ diffusion area 106 of a next BJT device in the string. In particular, each n-well 104 is tapped and fed to the p+ diffusion area 106 of the next BJT in the string. Any number of P-N junctions can be strung together in this way. Further, the n-wells 104 also form a rectifying junction with the substrate such that the "diode string" represents a chain of PNP connected transistors. An example of a four-stage diode string is described below with respect to FIG. 2.

FIG. 2 is a circuit diagram of a multi-stage n-well diode string 200 for providing electrostatic discharge (ESD) protection. The diode string 200 includes a first conductive terminal 202 connected to an emitter formed from a P-N junction of a bipolar junction transistor (BJT) 206. The base formed from the P-N junction is connected to an emitter of a second PNP, which is formed from a P-N junction of a BJT 208. The second BJT includes a base, which is connected to the emitter of a third BJT, which is formed from the P-N junction of a BJT 210. The third BJT has a base connected to an emitter of a fourth BJT, which is formed from the P-N junction of a BJT 212. The fourth BJT diode has a base connected to a second conductive terminal 204. This particular configuration is four diodes high.

In this configuration, BJT 206 has an emitter connected to the first conductive terminal 202, a base, and a collector connected to ground. BJT 208 has an emitter connected to the base of BJT 206, a base, and a collector connected to ground. BJT 210 has an emitter connected to the base of BJT 208, a base, and a collector connected to ground. BJT 212 has an emitter connected to the base of BJT 210, a base connected to the second conductive terminal 204, and a collector connected to ground.

In operation, when a differential voltage between the first and second conductive terminals 202 and 204 exceeds the turn on voltage equivalent to approximately four diode drops, the BJTs 206, 208, 210, and 212 are forward biased to sink current from conductive terminal 202 to ground. Unfortunately, the small vertical current gain ($\beta$) leads to an on resistance that approximately matches the overall diode resistance across the diode string 200, such as four times the diode resistance ($4R_d$).

Analyzing the effect of PNP bipolar current gain or ($\beta$) on the performance of the diode string, it should be appreciated that the collector current of BJT 206 is approximately equal to the emitter current times a beta factor $\beta(\beta/(\beta+1))$ as described above with respect to Equation 3. Since the emitter current of BJT 208 equals the base current of BJT 206, which is reduced as indicated above with respect to Equation 2, the collector current flowing into BJT 208 is also lower in proportion to the vertical current gain ($\beta$) according to the following equation:

$$I_{C2} = \frac{\beta}{(\beta+1)^2} I_{E1} \quad (4)$$

and the base current ($I_{B2}$) of BJT 208, which is the emitter current of BJT 210, is reduced according to the following equation:

$$I_{B2} = \frac{1}{(\beta+1)^2} I_{E1} \quad (5)$$

Thus, for a vertical current gain value of one ($\beta=1$), the collector current of BJT 206 is one-half of the emitter current flowing from conductive terminal 202 into the emitter of BJT 206. In this example, the collector current of BJT 208 is one-fourth of that same emitter current. As a result, a larger portion of the current is dissipated through BJT 206 than through subsequent BJTs 208, 210, and 212 through the diode string. Due to the value of the vertical current gain ($\beta$), each stage or transistor within the "diode string" has less voltage applied to it because less emitter current flows to each subsequent stage. Thus, the vertical current gain ($\beta$) has a substantial impact on the performance of the diode string.

FIG. 3 is a graph 300 of voltage versus current for conventional diode string. Graph 300 depicts an I-V curve for the diode string. In the normal regime 306, the diode string conducts no current as the voltage increases until the voltage level exceeds the voltage threshold ($V_T$) for the diode string. The on-voltage or voltage threshold is a function of the vertical current gain ($\beta$), temperature, and other factors. Once the voltage level exceeds the diode string's voltage threshold ($V_T$), the diode string shifts into an ESD regime 308 in which the diode string begins conducting more and more current. However, the resistance of the diode string is a function of the vertical current gain ($\beta$), which value can affect the potential built-up across the string at a given current as indicated by the arrow 310.

In general, the vertical current gain ($\beta$) strongly determines diode string characteristics, such as total substrate current, on-resistance, and the like. If the vertical current gain ($\beta$) is equal to one for a four-diode "high" string, approximately ninety-four (94%) of the current flows to the substrate through the collector currents as compared to current flow through the diode string because the diode resistances operate to divide the current flow at each stage. As technology scales, the vertical gain factor ($\beta$) tends to be smaller and smaller due to n-well retrograde doping profiles in order to fight latch-up. As the vertical gain factor ($\beta$) approaches zero, the resistance of the diode string approaches four times the diode resistance (i.e., $4R_d$) due to a corresponding loss of substrate shunting through the collectors. An example of a circuit to provide a reduced effective resistance of the diode string through shunt elements is described below with respect to FIG. 4.

FIG. 4 is a circuit diagram of ESD protection circuit 400 including a multi-stage diode string with a controlled shunt element added to each stage of the diode string. The ESD protection circuit 400 is similar to the diode string 200 in FIG. 2, except that resistive elements 402, 404, 406, and 408 are included to provide a resistive current flow path to ground from each base-emitter connection. In an example, resistive element 402 includes a first terminal connected to a base of BJT 206 and an emitter of BJT 208 and includes a second terminal connected to a power supply terminal (such as ground). Resistive element 404 includes a first terminal connected to a base of BJT 208 and to an emitter of BJT 210 and includes a second terminal connected to ground. Resistive element 406 includes a first terminal connected to a base of BJT 210 and to an emitter of BJT 212 and includes a second terminal to ground. Resistive element 408 includes a first terminal connected to a base of BJT 212 and to conductive terminal 204 and includes a second terminal connected to ground.

In the illustrated example, a shunt element is added to each stage of the diode string, e.g., to the base of each BJT 206, 208, 210, and 210, providing a current/voltage divider that operates to reduce the effective resistance of each stage of the diode string. The extra current flow path to ground causes each transistor stage to appear as if it has a higher vertical current gain ($\beta$) than it actually does. The overall resistance exhibited by the diode string is reduced and is highly independent of the default vertical current gain ($\beta$) for the process.

While the resistive elements 402, 404, 406, and 408 are depicted as discrete, static resistances, it should be appreciated that each of the resistive elements 402, 404, 406, and 408 may be implemented as externally controlled shunt elements, such as switches, or as adjustable resistors, making it possible to selectively alter the effective resistance of the diode string. Further, the inclusion of resistive elements within the diode string allows for a reduced "holding value" for the diode string to continue to dissipate current during an ESD event. In an example, the resistive elements make it possible to implement I-V curves with negative differential resistance regimes using only diodes that trigger with an on-voltage associated with the effective threshold voltage of the diode string but that hold at a lower voltage threshold. In a four diode stack, for example, the diode string may trigger at a voltage level of approximately four times the diode threshold voltage ($4\phi$) but hold at voltages of two or three times the threshold voltage ($2\phi$ or $3\phi$).

As discussed below with respect to FIGS. 5 and 6, the inclusion of the resistive elements enhances the performance of the diode string. Moreover, selection of the value of the vertical current gain (β) and/or selection or modulation of the values of the resistances impacts the effective "electrical height" of the diode string.

Figure 5:
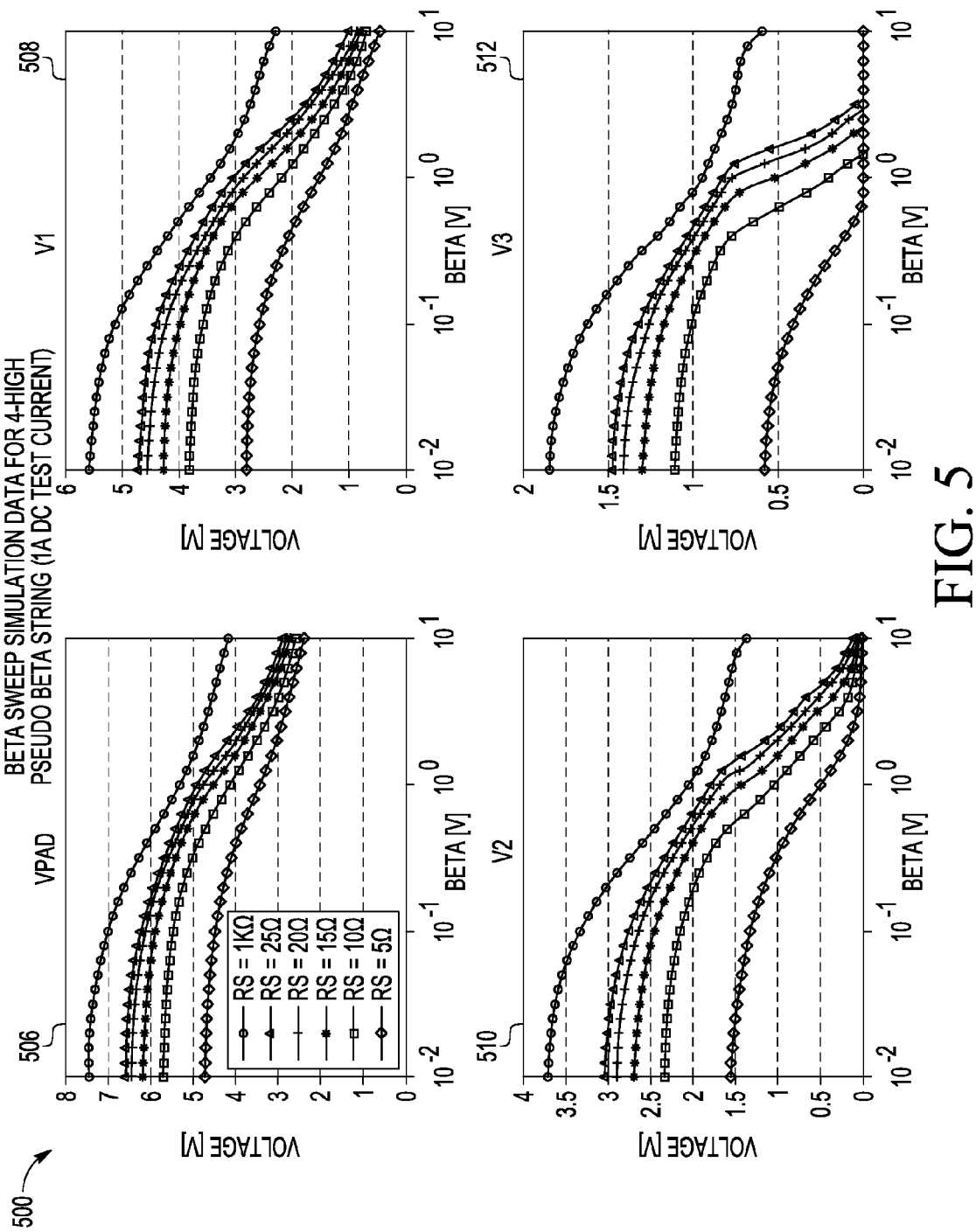
FIG. 5 illustrates multiple graphs depicting the raw emitter voltages ($V_E$) for the multi-stage diode string of FIG. 4 for different resistor values and different values of the vertical current gain ($\beta$).

FIG. 5 illustrates multiple graphs 500 depicting the raw emitter voltages ($V_E$) for the multi-stage diode string of FIG. 4 for different resistor values ranging from five ohms (5Ω) to one kilo-ohm (1 kΩ) and different values of the current gain (β) ranging from $10^{-2}$ to $10^1$. Graph 506 illustrates the emitter voltage of BJT 206 in FIG. 4 versus vertical current gain (β) due to the process used to fabricate BJT 206 for different resistance values of the resistive element 402 for BJT 206 within diode string 400. As shown, for resistive element 402 having a resistance of approximately five ohms (5Ω), diode string 400 exhibits up to a two volt (2V) reduction in peak voltage levels for different values of the vertical current gain (β) as compared to a resistive element having a resistance of approximately one kilo-ohm (1 kΩ).

Graph 508 illustrates the emitter voltage of BJT 208 versus vertical current gain (β) due to the process used to fabricate BJT 208 for different resistance values of the resistive element 404 of diode string 400. As shown, for resistive element 404 having a resistance of approximately five ohms (5Ω) as compared to a resistance value of approximately one kilo-ohm (1 kΩ), this stage of the diode string demonstrates up to approximately a three volt reduction in the peak voltage levels.

Graph 510 illustrates the emitter voltage of BJT 210 versus vertical current gain (β) due to the process used to fabricate BJT 210 for different resistance values of the resistive element 406 of diode string 400. As shown, for resistive element 406 having a resistance of approximately five ohms (5Ω) as compared to a resistance value of approximately one kilo-ohm (1 kΩ), this stage of diode string 400 demonstrates more than a two volt reduction in the peak voltage levels.

Graph 512 illustrates the emitter voltage of BJT 212 versus vertical current gain (β) due to the process used to fabricate BJT 212 for different resistance values of the resistive element 408 of diode string 400. As shown, for resistive element 408 having a resistance of approximately five ohms (5Ω) as compared to a resistance value of approximately one kilo-ohm (1 kΩ), this stage of diode string 400 demonstrates less than a one and a half volt reduction in the peak voltage levels. However, for certain resistance and vertical current gain (β) value combinations, this stage of diode string 400 is turned off, reducing the effective diode string "height" by one.

In the illustrated example, the emitter voltages are significantly reduced when the resistances of the resistive elements are relatively low. Similarly, different combinations of the resistance values and the vertical current gain (β) values can be employed to modulate the height of the diode string as described below with respect to FIG. 6.

Figure 6:
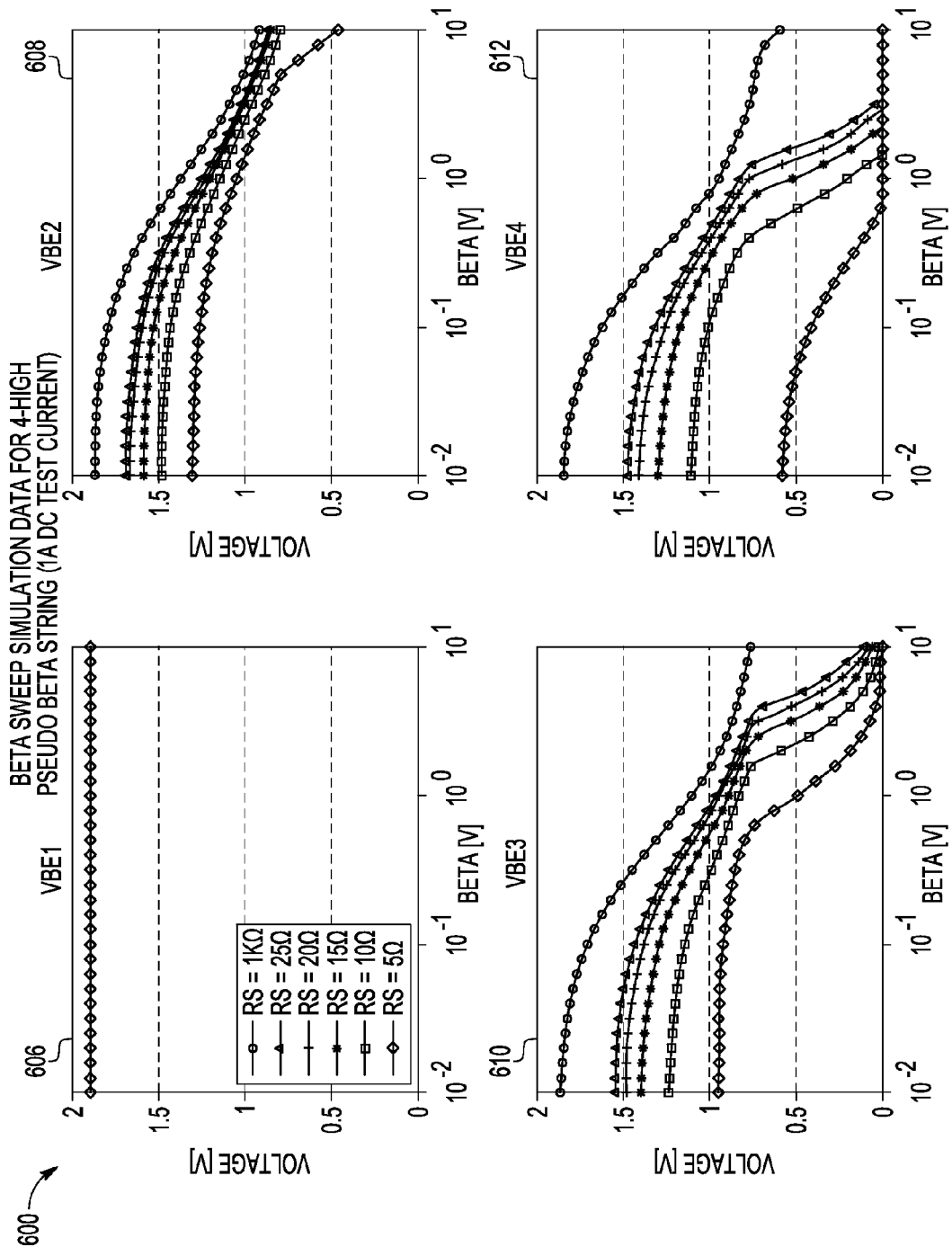
FIG. 6 illustrates multiple graphs depicting the emitter-base voltages ($V_{EB}$) for each stage of the multi-stage diode string of FIG. 4 for different resistor values and different values of the vertical current gain ($\beta$).

FIG. 6 illustrates multiple graphs 600 depicting the emitter-base voltages ($V_{EB}$) for each stage of the multi-stage diode string 400 of FIG. 4 for different resistor values and different values of the current gain (β). Graph 606 corresponds to the emitter-base voltage ($V_{EB}$) of BJT 206 in FIG. 4 versus the vertical current gain (β) due to the process used to fabricate BJT 206 for different values of resistive element 402. As shown, during an ESD event, this stage of diode string 400 is always on and the value of resistance of the resistive element plays no noticeable role in the level of the emitter-base voltage ($V_{EB}$).

Graph 608 corresponds to the emitter-base voltage ($V_{EB}$) of BJT 208 in FIG. 4 versus the vertical current gain (β) due to the process used to fabricate BJT 208 for different values of resistive element 404. As shown, during an ESD event, for different combinations of resistance values and vertical current gain (β) values, the emitter-base voltage ($V_{EB}$) can be reduced by up to half a volt (0.5V) for a five ohm (5Ω) resistance as compared to a one kilo-ohm (1 kΩ) resistance of resistive element 404. For a relatively high value of the vertical current gain (β=10) and a resistance of five ohms (5Ω), the emitter-base voltage ($V_{EB}$) approaches a diode threshold voltage level (approximately 0.5V).

Graph 610 corresponds to the emitter-base voltage ($V_{EB}$) of BJT 210 in FIG. 4 versus the vertical current gain (β) due to the process used to fabricate BJT 210 for different values of resistive element 406. As shown, during an ESD event, for different combinations of resistance values and vertical current gain (β) values, the emitter-base voltage ($V_{EB}$) can be reduced by up to approximately 0.9 volts for a five ohm (5Ω) resistance as compared to a one kilo-ohm (1 kΩ) resistance of resistive element 406. Further, for certain combinations of resistance values and vertical current gain (β) values, this stage turns off (e.g., for a resistance of five ohms and a vertical current gain of 1 (β=1)), because the emitter-base voltage ($V_{EB}$) falls below the threshold voltage of approximately 0.5V for the P-N junction of BJT 210. When the emitter-base voltage ($V_{EB}$) falls below this threshold, BJT 210 turns off, and the diode string 400 has an effective height of two diodes.

Graph 612 corresponds to the emitter-base voltage ($V_{EB}$) of BJT 212 in FIG. 4 versus the vertical current gain (β) due to the process used to fabricate BJT 212 for different values of resistive element 408. As shown, during an ESD event, for different combinations of resistance values and vertical current gain (β) values, the emitter-base voltage ($V_{EB}$) can be reduced by more than approximately 1.5 volts for a five ohm (5Ω) resistance as compared to a one kilo-ohm (1 kΩ) resistance of resistive element 408. This stage is mostly on, but is off for certain resistance values and certain values of the vertical current gain (β). When this stage turns off, the diode string has an effective height of only three diodes.

Figure 7:
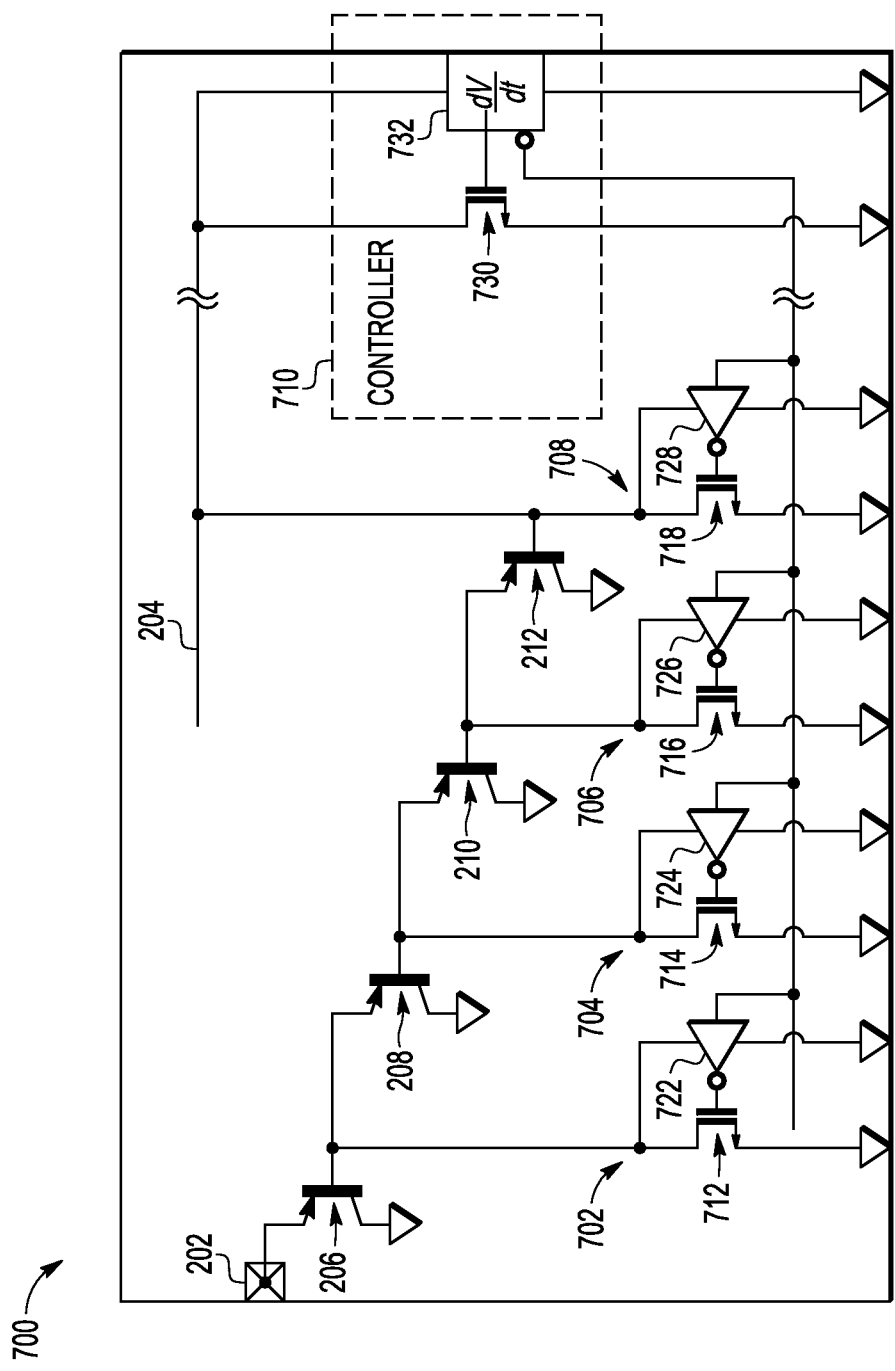
FIG. 7 is a diagram of an ESD protection circuit including a multi-stage diode string with controlled shunt elements and including a controller configured to control the shunt elements.

FIG. 7 is a diagram of an ESD protection circuit 700 including a multi-stage diode string 400 with controlled shunt elements 702, 704, 706, and 708 and including a controller 710 configured to control the shunt elements 702, 704, 706, and 708. ESD protection circuit 700 includes BJTs 206, 208, 210, and 212 connected such that their P-N junctions form a diode string 400. Resistive elements 402, 404, 406, and 408 in FIG. 4 are replaced with metal oxide semiconductor field effect transistors (MOSFETs) 712, 714, 716, and 718. Further, ESD protection circuit 700 includes controller 710 connected between conductive terminal 204 and ground. Controller 710 includes a detector 732 configured to detect a change in the voltage on conductive terminal 204 relative to ground and to apply a first control signal to a rail clamp 730, which has a drain connected to conductive terminal 204, a gate connected to a control output of detector 732, and a source connected to ground. Controller 710 further includes a second control output connected to inputs of inverters 722, 724, 726, and 728, which have outputs connected to the gates of MOSFETs 712, 714, 716, and 718, respectively.

MOSFET 712 includes a drain connected to the base of BJT 206 and to the emitter of BJT 208 and includes a source connected to ground. MOSFET 714 includes a drain connected to the base of BJT 208 and to the emitter of BJT 210 and includes a source connected to ground. MOSFET 716 includes a drain connected to the base of BJT 210 and to the emitter of BJT 212 and includes a source connected to ground. MOSFET 718 includes a drain connected to the base of BJT 212 and to conductive terminal 204 and includes a source connected to ground.

In an example, in response to an ESD event, controller 710 activates rail clamp 730 to limit a voltage differential between conductive terminal 204 and ground. Controller 710 also activates controllable shunt elements (MOSFETs 712, 714, 716, and 718) to selectively alter the effective resistance of the diode string 400 presented by BJTs 206, 208, 210, and 212, distributing current across the diode string such that ESD event-related current is dissipated through the collector currents of the collectors of MOSFETs 712, 714, 716, and 718 (as needed). Depending on the combination of the vertical current gain ($\beta$) and the resistance presented by each of the MOSFETs 712, 714, 716, and 718, some of the BJTs 206, 208, 210, and 212 may remain off during an ESD event.

In conjunction with the circuits and methods described above with respect to FIGS. 4-7, an ESD protection circuit is described that includes controllable shunt elements within a diode string to increase the effective vertical current gain ($\beta$) of each BJT stage in the diode string by lowering the effective resistance of the string more independently of the default vertical current gain ($\beta$) due to the fabrication process. This makes it possible to modulate the effective electrical height of the diode string by modulating values of the resistance provided by the controllable shunt elements and/or by adjusting the value of the vertical current gain ($\beta$). Further, the controllable resistances make it possible for the diode string to trigger at a voltage level that corresponds to an effective voltage threshold for the string and to hold at voltages that fall below that level.

While the above-referenced figures depicted static resistors in FIG. 4 and MOSFETs in FIG. 7, it should be appreciated that combinations thereof and/or other types of controllable shunt elements may be used to lower the effective resistance of the diode string. In an example, variable resistors or switched resistances (e.g., a MOSFET having a resistor connected between the source and ground) could be used to provide the desired resistances. Further, while the above-discussion presumes that the same shunt resistance is provided for each stage of the diode string, in some instances it may be desirable to vary the resistances of the resistive elements such that they decrease with each stage, increase with each stage, or otherwise vary from stage to stage to direct current through desired current paths while still increasing the effective vertical current gain ($\beta$) and while still reducing the effective resistance of the string.

Although the present invention has been described with reference to preferred embodiments, workers skilled in the art will recognize that changes may be made in form and detail without departing from the spirit and scope of the invention.

What is claimed is:

1. A circuit comprising:
an input terminal;
an electrostatic discharge (ESD) protection circuit comprising:
a diode string formed from a plurality of P-N junction devices arranged in series to form a plurality of stages, the diode string including an input coupled to the input terminal and including at least one output coupled to a first power supply terminal; and
a plurality of shunt elements, each of the plurality of shunt elements including a first terminal coupled to one of the plurality of P-N junction devices, a second terminal coupled to the first power supply terminal, each of the plurality of shunt elements controllable to selectively couple the one of the plurality of P-N junction devices to the first power supply terminal to distribute current flow to the first power supply terminal in response to an ESD event.

2. The circuit of claim 1, wherein the plurality of shunt elements operate to reduce an effective number of stages of the plurality of stages for discharging an ESD event.

3. The circuit of claim 1, wherein the diode string provides an overall resistance that changes in response to control of the plurality of shunt elements independent of a vertical current gain ($\beta$).

4. The circuit of claim 1, wherein each of the plurality of shunt elements includes a resistor.

5. The circuit of claim 1, wherein the plurality of P-N junction devices comprises:
a first bipolar junction transistor including a first current electrode coupled to the input terminal, a control electrode, and a second current electrode coupled to a power supply terminal; and
a second bipolar junction transistor including a first current electrode coupled to the control electrode of the first bipolar junction transistor, a control electrode, and a second current electrode coupled to the power supply terminal.

6. The circuit of claim 5, wherein the plurality of P-N junction devices further comprises at least one third bipolar junction transistor including a first current electrode coupled to the control electrode of the second bipolar junction transistor, a control electrode, and a second current electrode coupled to the power supply terminal.

7. The circuit of claim 5, wherein the plurality of shunt elements comprises:
a first shunt element including a first terminal coupled to the control electrode of the first bipolar junction transistor, and a second terminal coupled to a first power supply terminal; and
a second shunt element including a first terminal coupled to the control electrode of the second bipolar junction transistor, and a second terminal coupled to the first power supply terminal.

8. The circuit of claim 5, wherein the plurality of shunt elements comprises:
a first metal oxide semiconductor field effect transistor (MOSFET) including a first current electrode coupled to the control electrode of the first bipolar junction transistor, a control electrode, and a second current electrode coupled to the first power supply terminal; and
a second MOSFET including a first current electrode coupled to the control electrode of the second bipolar junction transistor, a control electrode, and a second current electrode coupled to the first power supply terminal.

9. The circuit of claim 8, further comprising a control circuit including a first terminal coupled to a power supply terminal, a second terminal coupled to ground, and a control output coupled to the control electrodes of the first MOSFET and the second MOSFET.

10. A circuit comprising:
an input terminal;
an electrostatic discharge (ESD) protection circuit comprising:
a diode string formed from P-N junctions of a plurality of bipolar junction transistors, the diode string including a first terminal coupled to the input terminal and a second terminal coupled to a power supply terminal; and
a plurality of shunt elements, each of the plurality of shunt elements including a first terminal coupled to an anode terminal of a diode of the diode string and including a second terminal to the power supply terminal, each of the plurality of shunt elements controllable to selectively provide a current flow path from the anode terminal to the power supply terminal in response to an ESD event.

11. The circuit of claim 10, wherein each of the plurality of shunt elements comprises a resistor including a first terminal coupled to the anode terminal and a second terminal coupled to the power supply terminal.

12. The circuit of claim 10, wherein each of the plurality of bipolar junction transistors comprises a PNP transistor.

13. The circuit of claim 10, wherein the plurality of bipolar junction transistors comprises:
a first transistor including a first current electrode coupled to the input terminal, a base, and a second current electrode coupled to the power supply terminal; and
a second transistor including an first current electrode coupled to the base of the first transistor, a base, and a second current electrode coupled to the power supply terminal.

14. The circuit of claim 13, wherein the plurality of shunt elements comprises:
a first metal oxide semiconductor field effect transistor (MOSFET) including a drain coupled to the base of the first transistor, a gate, and a source coupled to the power supply terminal; and
a second MOSFET including a drain coupled to the base of the second transistor, a gate, and a source coupled to the power supply terminal.

15. The circuit of claim 14, further comprising:
a first inverter including an input and including an output coupled to the gate of the first MOSFET;
a second inverter including an input and including an output coupled to the gate of the second MOSFET; and
a rail clamp circuit coupled between the power supply terminal and a second power supply terminal, the rail clamp circuit including a control terminal coupled to the inputs of the first and second inverters, the rail clamp circuit configured to generate a control signal to bias the first and second MOSFETs in response to a voltage on the power supply terminal.

16. A circuit for electrostatic discharge (ESD) protection, the circuit comprising:
a first conductive terminal;
a second conductive terminal;
a diode string formed from P-N junctions of a plurality of bipolar junction transistors, the diode string including an input coupled to the first conductive terminal and including an output coupled to the second conductive terminal;
a plurality of controllable shunt elements, each of the plurality of controllable shunt elements including a first terminal coupled to an anode of a diode from the diode string, a second terminal coupled to a power supply terminal, and a control terminal; and
a controller coupled to the control terminal of each of the plurality of controllable shunt elements to controllably alter a pseudo beta of each stage of the diode string in response to an ESD event.

17. The circuit of claim 16, wherein the controller biases the plurality of controllable shunt elements to control an overall on-resistance of the diode string.

18. The circuit of claim 16, wherein the controller comprises:
a detector including an input coupled to the power supply terminal, a second input coupled to a second power supply terminal, a first control terminal for providing a first control signal and second control signal, the detector configured to detect an ESD event and to generate the first and a second control signals in response thereto, the detector to provide the first control signal to the control terminal of each of the plurality of controllable shunt elements; and
a rail clamp transistor including a first terminal coupled to the power supply terminal, a second terminal coupled to the second power supply terminal, and a control output coupled to the detector for receiving the second control signal, the rail clamp transistor to shunt current between the second power supply terminal and the first power supply terminal.

19. The circuit of claim 16, wherein each of the plurality of bipolar junction transistors includes an emitter, a base, and a collector, the plurality of bipolar junction transistors comprises:
a first transistor including an emitter coupled to the first conductive terminal, a base, and a collector coupled to the power supply terminal;
a second transistor including an emitter coupled to the base of the first transistor, a base, and a collector coupled to the power supply terminal; and
at least one third transistor including an emitter coupled to the base of the second transistor, a base coupled to the second conductive terminal, and a collector coupled to the power supply terminal.

20. The circuit of claim 19, wherein each of the plurality of controllable shunt elements comprises:
a first metal oxide semiconductor field effect transistor (MOSFET) including a first current electrode coupled to the base of the first transistor, the control terminal coupled to the controller, and a second current electrode coupled to the power supply terminal;
a second MOSFET including a first current electrode coupled to the base of the second transistor, the control terminal coupled to the controller, and a second current electrode coupled to the power supply terminal; and
at least one third MOSFET including a first current electrode coupled to the base of the third transistor, the control terminal coupled to the controller, and a second current electrode coupled to the power supply terminal.

* * * * *